(12) United States Patent
Chang et al.

(10) Patent No.: US 6,875,692 B1
(45) Date of Patent: Apr. 5, 2005

(54) COPPER ELECTROMIGRATION INHIBITION BY COPPER ALLOY FORMATION

(75) Inventors: Chung-Liang Chang, Hsin-chu (TW); Shaulin Shue, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 76 days.

(21) Appl. No.: 10/191,825

(22) Filed: Jul. 9, 2002

(51) Int. Cl.$^7$ .............................................. H01L 21/44
(52) U.S. Cl. ................................... 438/687; 438/608
(58) Field of Search ........................ 438/604, 608, 438/687, 923

(56) References Cited

U.S. PATENT DOCUMENTS

| | | | |
|---|---|---|---|
| 6,022,808 A | 2/2000 | Nogami et al. | 438/694 |
| 6,147,000 A | 11/2000 | You et al. | 438/687 |
| 6,162,667 A | 12/2000 | Funai et al. | 438/166 |
| 6,197,688 B1 | 3/2001 | Simpson | 438/678 |
| 6,268,291 B1 | 7/2001 | Andricacos et al. | 438/694 |
| 6,426,293 B1 * | 7/2002 | Wang et al. | 438/687 |

* cited by examiner

*Primary Examiner*—Minh Tang
*Assistant Examiner*—Lisa Kilday
(74) *Attorney, Agent, or Firm*—Haynes and Boone, LLP

(57) ABSTRACT

A method of forming a copper structure, comprising the following steps. A substrate is provided. A patterned dielectric layer is formed over the substrate with the patterned dielectric layer having an opening exposing a portion of the substrate. The opening having exposed sidewalls. A Sn layer is formed directly upon the exposed sidewalls of the opening. A copper seed layer is formed upon the Sn layer within the opening. A bulk copper layer is formed over the copper seed layer, filling the opening. The structure is thermally annealed whereby Sn diffuses from the Sn layer into the copper seed layer and the bulk copper layer forming CuSn alloy within the copper seed layer and the bulk copper layer.

44 Claims, 1 Drawing Sheet

//...

COPPER ELECTROMIGRATION INHIBITION BY COPPER ALLOY FORMATION

BACKGROUND OF THE INVENTION

As the copper (Cu) interconnection size scales down, the step coverage and overhang of the physical vapor deposition (PVD) barrier is becoming worse for the 0.1 μm generation and beyond, especially with deep vias and trenches.

U.S. Pat. No. 6,197,688 B1 to Simpson describes a palladium-tin (Pb—Sn) catalyst layer 31 for a copper (Cu) electroless deposition.

U.S. Pat. No. 6,022,808 to Nogami et al. describes an electroless Cu deposition with improved electromigration by forming a Sn-doped Cu layer over a Cu layer.

U.S. Pat. No. 6,147,000 to You et al. describes an electroless Cu deposition with improved electromigration by diffusing Sn into a Cu layer.

U.S. Pat. No. 6,268,291 B1 to Andricacos et al. describes an electroless Cu deposition with improved electromigration by implanting Sn into a Cu layer.

U.S. Pat. No. 6,162,667 to Funai et al. describes a method for fabricating thin film transistors that is related to the instant invention.

SUMMARY OF THE INVENTION

Accordingly, it is an object of one or more embodiments of the present invention to provide an improved method of reflowing bumps.

Other objects will appear hereinafter.

It has now been discovered that the above and other objects of the present invention may be accomplished in the following manner. Specifically, a substrate is provided. A patterned dielectric layer is formed over the substrate with the patterned dielectric layer having an opening exposing a portion of the substrate. The opening having exposed sidewalls. A Sn layer is formed directly upon the exposed sidewalls of the opening. A copper seed layer is formed upon the Sn layer within the opening. A bulk copper layer is formed over the copper seed layer, filling the opening. The structure is thermally annealed whereby Sn diffuses from the Sn layer into the copper seed layer and the bulk copper layer forming CuSn alloy within the copper seed layer and the bulk copper layer.

DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

Initial Structure

Figure 1:
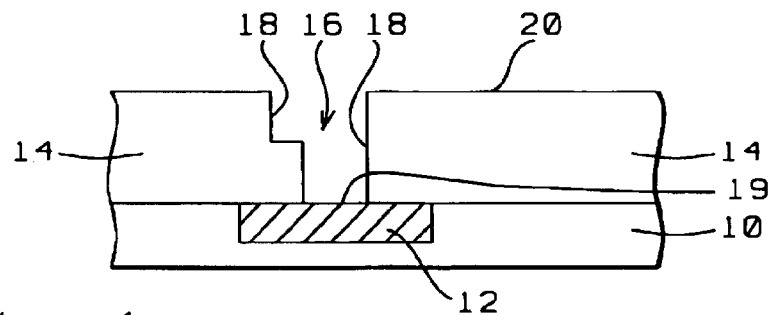
FIGS. 1 to 4 schematically illustrate a preferred embodiment of the present invention.

As shown in FIG. 1, structure 10 includes an exposed conductive structure 12 that is preferably comprised of a metal such as copper, aluminum, gold or silver and is more preferably copper. Conductive structure 12 may be lines or plugs, for example.

Structure 10 is preferably a silicon substrate and is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

A patterned dielectric layer 14 having opening 16 is formed over semiconductor substrate 10 and conductive structure 12 to a thickness of preferably from about 3000 to 15,000 Å and more preferably from about 4000 to 10,000 Å. Dielectric layer 14 is preferably comprised of a low-k dielectric material such as inorganic chemical vapor deposition (CVD) low-k dielectric material, organic spin-on low-k dielectric material or fluorine-doped silicon oxide and is more preferably comprised of fluorine-doped silicon oxide. Dielectric layer 14 has an upper surface 20.

Opening 16 may be a damascene or dual damascene opening and has exposed vertical and horizontal sidewalls 18. Opening 16 exposes a portion 19 of conductive structure 12.

One advantage of the present invention is that no barrier layer is formed within opening 16 upon sidewalls 18.

Formation of Mono-Layer 22 of Sn Upon Sidewalls 18 of Opening 16

Figure 2:
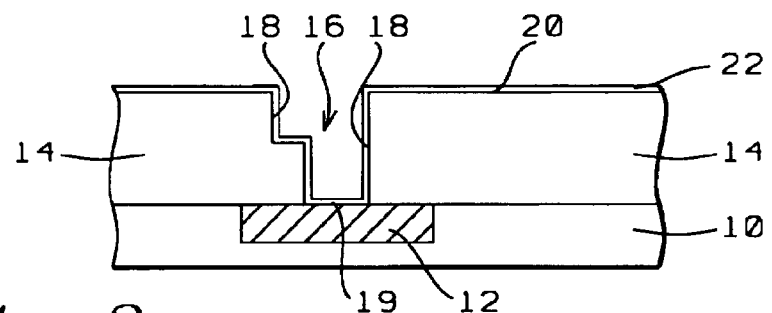

As shown in FIG. 2, a mono-layer 22 of tin (Sn) is formed upon: the sidewalls 18 of opening 16; the exposed portion 19 of conductive structure 12; and over the upper surface 20 of patterned dielectric layer 14 by adsorption.

Sn mono-layer 22 may be formed by a wet acid immersion process using an acid solution comprised of stannous chloride and hydrogen chloride. The acid solution composition includes from about 10 to 150 g/l aqueous stannous chloride and from about 10 to 75 g/l aqueous hydrogen chloride.

Formation of Copper (Cu) Seed Layer 28

Figure 3:
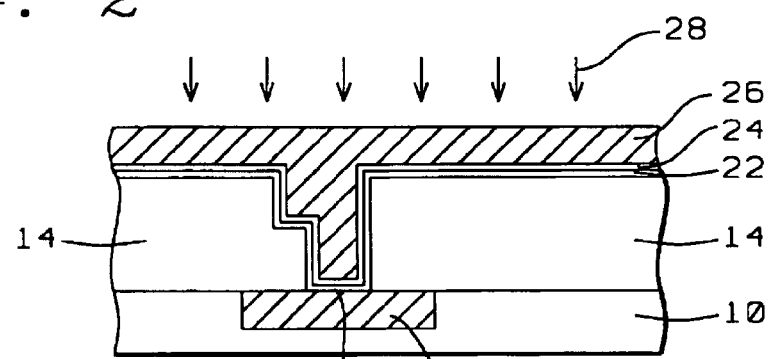

As shown in FIG. 3, a copper (Cu) seed layer 24 is formed over the Sn mono-layer 22 to a thickness of preferably from about 20 to 90 Å and more preferably from about 50 to 70 Å. Cu seed layer is preferably formed by an electroless copper process, a physical vapor deposition (PVD) copper process or a dry chemical vapor deposition (CVD) copper process and is more preferably formed by a PVD copper process or a CVD dry process.

Formation of Bulk Copper (Cu) Layer 26

As shown in FIG. 3, a bulk copper (Cu) layer 26 is formed over Cu seed layer 24, at least filling opening 16; and covering Cu seed layer 24 over the top surface 20 of patterned dielectric layer 14 to a thickness of preferably from about 5000 to 13,000 Å and more preferably from about 6000 to 7000 Å. Bulk Cu layer 26 is preferably formed by an electroplating process.

Thermal Annealing 28

As further shown in FIG. 3, a thermal anneal 28 is applied to the structure at: preferably a temperature of from about 230 to 420° C. for from about 20 to 90 minutes; and more preferably a temperature of from about 250 to 400° C. for from about 30 to 60 minutes. Thermal anneal 28 diffuses Sn from the Sn mono-layer 22 into: (1) the Cu seed layer 22 to form a CuSn alloy adjacent the vertical and horizontal sidewalls 18 of dielectric layer 14; and (2) into the Cu bulk layer 26 to form some CuSn alloy in the Cu bulk layer 26.

The Sn thus serves to trap Cu atoms by diffusing into the grain boundary between the Sn mono-layer 22 and the Cu seed layer 24/Cu bulk layer 26 so that Cu diffusion and migration into the patterned dielectric layer 14 is inhibited.

Planarization of Cu bulk layer 26

Figure 4:
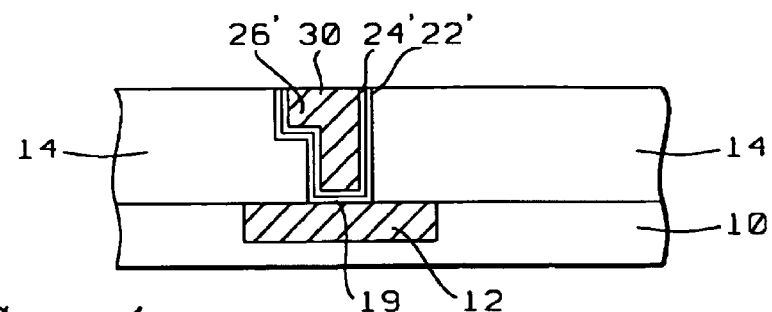

As shown in FIG. 4, Cu bulk layer 26 is planarized, preferably by chemical mechanical polishing (CMP) to remove the excess Cu/CuSn bulk layer 26, Cu/CuSn seed layer 24 and remaining Sn mono-layer 22 from over the top surface 20 of patterned dielectric layer 14 to form a planarized structure 30 within opening 16 comprised of planarized Cu/CuSn bulk layer 26', Cu/CuSn seed layer 24' and remaining Sn mono-layer 22'.

The inventors have determined that a marked decrease in the Cu grain boundary diffusivity and electromigration (EM) drift velocity is attributed to Sn trapping of Cu atoms. For example an addition of from about 0.2 to 2.5 weight % of Sn increased the activation energy for Cu EM from about 0.7 to 0.9 eV to about 1.1 to 1.3 eV.

Advantages of the Present Invention

The advantaged of one or more embodiments of the present invention include:
1. improved Cu EM reliability;
2. increase the Cu EM resistance;
3. increase the diffusion resistance; and
4. replacement of the PVD-barrier layer by the adsorption of the Sn mono-layer directly on the exposed dielectric layer.

While particular embodiments of the present invention have been illustrated and described, it is not intended to limit the invention, except as defined by the following claims.

We claim:

1. A method of forming a copper structure, comprising the steps of:
   providing a substrate;
   forming a patterned dielectric layer over the substrate; the patterned dielectric layer having an opening exposing a portion of the substrate; the opening having exposed sidewalls;
   forming a Sn layer directly upon the exposed sidewalls of the opening;
   forming a copper seed layer upon the Sn layer within the opening;
   forming a bulk copper layer over the copper seed layer, filling the opening; and
   thermally annealing the structure whereby Sn diffuses from the Sn layer into the copper seed layer and the bulk copper layer forming CuSn alloy within the copper seed layer and the bulk copper layer.

2. The method of claim 1, wherein the substrate is a semiconductor substrate and includes a conductive structure which is at least partially exposed by the opening.

3. The method of claim 1, wherein the patterned dielectric layer has a thickness of from about 3000 to 15,000 Å and the copper seed layer has a thickness of from about 20 to 90 Å.

4. The method of claim 1, wherein the patterned dielectric layer has a thickness of from about 4000 to 10,000 Å and the copper seed layer has a thickness of from about 50 to 70 Å.

5. The method of claim 1, wherein the thermal anneal is conducted at a temperature of from about 230 to 420° C. for from about 20 to 90 minutes.

6. The method of claim 1, wherein the thermal anneal is conducted at a temperature of from about 250 to 400° C. for from about 30 to 60 minutes.

7. The method of claim 1, wherein the Sn layer is formed by a wet process.

8. The method of claim 1, wherein the Sn layer is formed by an acid immersion process.

9. The method of claim 1, wherein the Sn layer is formed by an acid immersion process using an acid solution comprised of stannous chloride and hydrogen chloride.

10. The method of claim 1, wherein the Sn layer is formed by an acid immersion process using an acid solution comprised of from about 10 to 150 g/l aqueous stannous chloride and from about 10 to 75 g/l aqueous hydrogen chloride.

11. The method of claim 1, wherein the copper seed layer is formed by a process selected from the group consisting of an electroless copper process, a physical vapor deposition (PVD) copper process and a chemical vapor deposition (CVD) copper process.

12. The method of claim 1, wherein the copper seed layer is formed by a PVD copper process or a CVD copper process.

13. The method of claim 1, wherein the bulk copper layer is formed by electroplating.

14. The method of claim 1, wherein the bulk copper layer is planarized to form a planarized copper structure within the opening.

15. The method of claim 1, wherein the Sn layer is a mono-layer and the diffused Sn increases the copper electromigration resistance and the copper diffusion resistance of the copper seed layer and the bulk copper layer.

16. A method of forming a copper structure, comprising the steps of:
   providing a substrate;
   forming a patterned dielectric layer over the substrate; the patterned dielectric layer having an upper surface and an opening exposing a portion of the substrate; the opening having exposed sidewalls;
   forming a Sn layer directly upon the patterned dielectric layer upper surface and the exposed sidewalls of the patterned dielectric layer opening;
   forming a copper seed layer upon the Sn layer within the opening and over the upper surface of the patterned dielectric layer;
   forming a bulk copper layer over the copper seed layer, at least filling the opening; and
   thermally annealing the structure whereby Sn diffuses from the Sn layer into the copper seed layer and the bulk copper layer forming CuSn alloy within the copper seed layer and the bulk copper layer.

17. The method of claim 16, wherein the substrate is a semiconductor substrate and includes a conductive structure which is at least partially exposed by the opening.

18. The method of claim 16, wherein the patterned dielectric layer has a thickness of from about 3000 to 15,000 Å, the copper seed layer has a thickness of from about 20 to 90 Å and the bulk copper layer has a thickness of from about 5000 to 13,000 Å above the patterned dielectric layer upper surface.

19. The method of claim 16, wherein the patterned dielectric layer has a thickness of from about 4000 to 10,000 Å, the copper seed layer has a thickness of from about 50 to 70 Å and the bulk copper layer has a thickness of from about 6000 to 7000 Å above the patterned dielectric layer upper surface.

20. The method of claim 16, wherein the thermal anneal is conducted at a temperature of from about 230 to 420° C. for from about 20 to 90 minutes.

21. The method of claim 16, wherein the thermal anneal is conducted at a temperature of from about 250 to 400° C. for from about 30 to 60 minutes.

22. The method of claim 16, wherein the Sn layer is formed by a wet process.

23. The method of claim 16, wherein the Sn layer is formed by an acid immersion process.

24. The method of claim 16, wherein the Sn layer is formed by an acid immersion process using an acid solution comprised of stannous chloride and hydrogen chloride.

25. The method of claim 16, wherein the Sn layer is formed by an acid immersion process using an acid solution comprised of from about 10 to 150 g/l aqueous stannous chloride and from about 10 to 75 g/l aqueous hydrogen chloride.

26. The method of claim 16, wherein the copper seed layer is formed by a process selected from the group consisting of an electroless copper process, a physical vapor deposition (PVD) copper process and a chemical vapor deposition (CVD) copper process.

27. The method of claim 16, wherein the copper seed layer is formed by a PVD copper process or a CVD copper process.

28. The method of claim 16, wherein the bulk copper layer is formed by electroplating.

29. The method of claim 16, wherein the bulk copper layer is planarized to form a planarized copper structure within the opening.

30. The method of claim 16, wherein the Sn layer is a mono-layer and the diffused Sn increases the copper electromigration resistance and the copper diffusion resistance of the copper seed layer and the bulk copper layer.

31. A method of forming a copper structure, comprising the steps of:
   providing a substrate;
   forming a patterned dielectric layer over the substrate; the patterned dielectric layer having an opening exposing a portion of the substrate; the opening having exposed sidewalls;
   forming a Sn mono-layer directly upon the exposed sidewalls of the opening;
   forming a copper seed layer upon the Sn mono-layer within the opening;
   forming a bulk copper layer over the copper seed layer, filling the opening; and
   thermally annealing the structure whereby Sn diffuses from the Sn mono-layer into the copper seed layer and the bulk copper layer forming CuSn alloy within the copper seed layer and the bulk copper layer.

32. The method of claim 31, wherein the substrate is a semiconductor substrate and includes a conductive structure which is at least partially exposed by the opening.

33. The method of claim 31, wherein the patterned dielectric layer has a thickness of from about 3000 to 15,000 Å and the copper seed layer has a thickness of from about 20 to 90 Å.

34. The method of claim 31, wherein the patterned dielectric layer has a thickness of from about 4000 to 10,000 Å and the copper seed layer has a thickness of from about 50 to 70 Å.

35. The method of claim 31, wherein the thermal anneal is conducted at a temperature of from about 230 to 420° C. for from about 20 to 90 minutes.

36. The method of claim 31, wherein the thermal anneal is conducted at a temperature of from about 250 to 400° C. for from about 30 to 60 minutes.

37. The method of claim 31, wherein the Sn mono-layer is formed by a wet process.

38. The method of claim 31, wherein the Sn mono-layer is formed by an acid immersion process.

39. The method of claim 31, wherein the Sn layer is formed by an acid immersion process using an acid solution comprised of stannous chloride and hydrogen chloride.

40. The method of claim 31, wherein the Sn layer is formed by an acid immersion process using an acid solution comprised of from about 10 to 150 g/l aqueous stannous chloride and from about 10 to 75 g/l aqueous hydrogen chloride.

41. The method of claim 31, wherein the copper seed layer is formed by a process selected from the group consisting of an electroless copper process, a physical vapor deposition (PVD) copper process and a chemical vapor deposition (CVD) copper process.

42. The method of claim 31, wherein the copper seed layer is formed by a PVD copper process or a CVD copper process.

43. The method of claim 31, wherein the bulk copper layer is formed by electroplating.

44. The method of claim 31, wherein the bulk copper layer is planarized to form a planarized copper structure within the opening.

* * * * *

UNITED STATES PATENT AND TRADEMARK OFFICE
CERTIFICATE OF CORRECTION

PATENT NO. : 6,875,692 B1
DATED : April 5, 2005
INVENTOR(S) : Chung-Liang Chang et al.

It is certified that error appears in the above-identified patent and that said Letters Patent is hereby corrected as shown below:

Column 1,
Line 5, insert -- FIELD OF THE INVENTION
 The present invention relates generally to semiconductor fabrication and more specifically to electroless deposition processes. --

Column 3,
Line 19, the word "advantaged" should be replaced with -- advantages --.

Signed and Sealed this

Twelfth Day of July, 2005

JON W. DUDAS
*Director of the United States Patent and Trademark Office*